United States Patent
Pergande (10) Patent No.: US 10,669,430 B2
(45) Date of Patent: Jun. 2, 2020

(54) ANTI-REFLECTIVE COATING FOR TRANSPARENT END EFFECTORS

(71) Applicant: Varian Semiconductor Equipment Associates, Inc., Gloucester, MA (US)

(72) Inventor: Paul E. Pergande, Austin, TX (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 16/037,494

(22) Filed: Jul. 17, 2018

(65) Prior Publication Data

US 2020/0024459 A1    Jan. 23, 2020

(51) Int. Cl.

| H01L 21/00 | (2006.01) |
|---|---|
| C09D 5/00 | (2006.01) |
| C09D 1/00 | (2006.01) |
| G02B 1/115 | (2015.01) |
| H01L 21/687 | (2006.01) |

(Continued)

(52) U.S. Cl.
CPC .............. *C09D 5/006* (2013.01); *C09D 1/00* (2013.01); *G02B 1/115* (2013.01); *H01L 21/67115* (2013.01); *H01L 21/68757* (2013.01); *H01L 21/68785* (2013.01); *F21Y 2115/10* (2016.08); *H01K 1/04* (2013.01)

(58) Field of Classification Search
CPC ................................................ H01L 21/67115
See application file for complete search history.

(56) References Cited

U.S. PATENT DOCUMENTS

| 4,047,496 A | * | 9/1977 | McNeilly | .............. | C30B 25/105 |
|---|---|---|---|---|---|
| | | | | | 118/725 |
| 4,482,393 A | * | 11/1984 | Nishiyama | ........ | H01L 21/26513 |
| | | | | | 438/530 |

(Continued)

FOREIGN PATENT DOCUMENTS

| EP | 2484804 A1 | 8/2012 |
|---|---|---|
| JP | 2012-195347 A | 10/2012 |

OTHER PUBLICATIONS

International Search Report and Written Opinion dated Oct. 28, 2019 in corresponding PCT application No. PCT/US2019/041285.

*Primary Examiner* — Nicholas J Tobergte
(74) *Attorney, Agent, or Firm* — Nields, Lemack & Frame, LLC (57) ABSTRACT

A workpiece support, such as an end effector, is coated on at least one of its surfaces with an anti-reflective material. The anti-reflective material improves the transmission of light through the workpiece support. The workpiece support may be disposed in a chamber, with heating elements disposed beneath the workpiece support, such that the workpiece support is disposed between the heating elements and the workpiece. In certain embodiments, the heating elements may be LEDs or tungsten halogen lamps. The anti-reflective material allows more efficient energy transfer from the heating elements to the workpiece. This may result in improved temperature uniformity across the workpiece. The anti-reflective material may be magnesium fluoride or a multi-layer optical coating. Alternatively, the heating elements may be disposed above the workpiece. In this case, the reduced reflection from the workpiece support may minimize the temperature increase on the portion of the workpiece disposed above the workpiece support.

19 Claims, 5 Drawing Sheets

(51) Int. Cl.
*H01L 21/67* (2006.01)
*H01K 1/04* (2006.01)
*F21Y 115/10* (2016.01)

(56) References Cited

U.S. PATENT DOCUMENTS

| | | | | |
|---|---|---|---|---|
| 5,214,277 | A * | 5/1993 | Drennen, III | G01N 21/03 |
| | | | | 250/216 |
| 5,444,815 | A * | 8/1995 | Lee | G01J 5/0003 |
| | | | | 118/724 |
| 5,781,693 | A * | 7/1998 | Ballance | C23C 16/45565 |
| | | | | 118/724 |
| 5,861,609 | A * | 1/1999 | Kaltenbrunner | H01L 21/2686 |
| | | | | 118/50.1 |
| 6,350,964 | B1 * | 2/2002 | Boas | H01L 21/67115 |
| | | | | 118/724 |
| 6,578,589 | B1 * | 6/2003 | Mayusumi | H01L 21/67034 |
| | | | | 134/61 |
| 6,592,661 | B1 * | 7/2003 | Thakur | C30B 31/12 |
| | | | | 117/103 |
| 6,835,914 | B2 * | 12/2004 | Timans | F27B 5/04 |
| | | | | 118/50.1 |
| 8,107,800 | B2 * | 1/2012 | Bezama | H01L 21/6875 |
| | | | | 392/407 |
| 8,398,355 | B2 * | 3/2013 | Holtkamp | H01L 21/67173 |
| | | | | 414/217 |
| 9,842,752 | B2 | 12/2017 | Bernhardt et al. | |
| 10,373,860 | B2 * | 8/2019 | Sundararajan | H01L 21/68764 |
| 2013/0252424 | A1 * | 9/2013 | Lin | H01L 21/68735 |
| | | | | 438/689 |
| 2014/0197134 | A1 * | 7/2014 | Qin | G01N 21/73 |
| | | | | 216/60 |
| 2016/0049313 | A1 | 2/2016 | Kumar et al. | |
| 2017/0004982 | A1 * | 1/2017 | Sundararajan | H01L 21/68785 |
| 2018/0308661 | A1 * | 10/2018 | Collins | H01J 37/321 |
| 2018/0308666 | A1 * | 10/2018 | Collins | H01J 37/321 |
| 2018/0374684 | A1 * | 12/2018 | Collins | C23C 16/4586 |
| 2018/0374686 | A1 * | 12/2018 | Collins | C23C 16/45519 |

* cited by examiner

ANTI-REFLECTIVE COATING FOR TRANSPARENT END EFFECTORS

FIELD

Embodiments of the present disclosure relate to systems that utilize a workpiece support to hold a workpiece, and more particularly, to a transparent end effector coated with an anti-reflective material.

BACKGROUND

The fabrication of a semiconductor device involves a plurality of discrete and complex processes. In certain processes, it may be advantageous to heat the workpiece so that the process achieves the desired result. One method of heating the workpiece is through the use of heat lamps. For example, tungsten halogen light bulbs may be used to emit energy toward the workpiece. In other embodiments, LED lights may provide the thermal energy.

Power from tungsten halogen bulbs is emitted at wavelengths ranging from about 400 nm to 2600 nm, with the peak being at approximately 1000 nm. At wavelengths between 600 nm and 1800 nm, the emitted power is at least half the maximum emitted power. The distribution of energy may vary for other heating elements.

In certain embodiments, the workpiece is disposed on a workpiece support, and is heated by heating elements disposed below the workpiece. In other words, the workpiece support is disposed between the heating elements and the workpiece. Thus, the workpiece support may block some of the light from reaching the workpiece. To mitigate this problem, the end effector may be constructed from a transparent material, such as clear quartz. Tests have shown that about 88% of the light energy passes through a workpiece support constructed from clear quartz.

However, at elevated temperatures, such as 500° C., the workpiece support may affect the local temperature of the workpiece. For example, the portion of the workpiece directly above the workpiece support may be 50° C. cooler than the other portions of the workpiece.

Therefore, it would be advantageous if there were an apparatus that could support the workpiece without adversely affecting the passage of light energy to the workpiece. It would be beneficial if such an apparatus could be used on existing systems.

SUMMARY

A workpiece support, such as an end effector, is coated on at least one of its surfaces with an anti-reflective material. The anti-reflective material improves the transmission of light through the workpiece support. The workpiece support may be disposed in a chamber, with heating elements disposed beneath the workpiece support, such that the workpiece support is disposed between the heating elements and the workpiece. In certain embodiments, the heating elements may be LEDs or tungsten halogen lamps. The anti-reflective material allows more efficient energy transfer from the heating elements to the workpiece. This may result in improved temperature uniformity across the workpiece. The anti-reflective material may be magnesium fluoride or a multi-layer optical coating. The anti-reflective material may also be one or more of $SiO_2$, $CeF_3$, $Al_2O_3$, $Y_2O_3$, $HfO_2$, $Sc_2O_3$, $Ta_2O_5$, $Nb_2O_5$, $LaTiO_3$ and $TiO_2$. Alternatively, the heating elements may be disposed above the workpiece. In this case, the reduced reflection from the workpiece support may minimize the temperature increase on the portion of the workpiece disposed above the workpiece support.

According to one embodiment, a processing chamber is disclosed. The processing chamber comprises a workpiece support to hold a workpiece, the workpiece support comprising: a top surface proximate the workpiece and a bottom surface; and an anti-reflective material disposed on at least a portion of the top surface or the bottom surface; and a heating element, wherein the workpiece support is disposed between the heating element and the workpiece. In certain embodiments, the top surface of the workpiece support does not contact an entirety of the workpiece. In certain embodiments, the workpiece support is nearly transparent at wavelengths emitted by the heating element. In some further embodiments, the workpiece support comprises clear quartz. In certain embodiments, the heating element comprises a tungsten halogen bulb or an LED. In certain embodiments, the anti-reflective material is disposed on the top surface and the bottom surface. In other embodiments, the anti-reflective material is disposed on the bottom surface. In some embodiments, the anti-reflective material is selected from the group consisting of magnesium fluoride, $SiO_2$, $CeF_3$, $Al_2O_3$, $Y_2O_3$, $HfO_2$, $Sc_2O_3$, $Ta_2O_5$, and $Nb_2O_5$, $LaTiO_3$ and $TiO_2$.

According to another embodiment, a processing chamber is disclosed. The processing chamber comprises a workpiece support to hold a workpiece, the workpiece support comprising: a top surface proximate the workpiece and a bottom surface; and an anti-reflective material disposed on at least a portion of the top surface or the bottom surface; and a heating element, wherein the workpiece is disposed between the heating element and the workpiece support. In certain embodiments, the top surface of the workpiece support does not contact an entirety of the workpiece. In certain embodiments, the heating element comprises a tungsten halogen bulb or an LED. In certain embodiments, the anti-reflective material is disposed on the top surface and the bottom surface. In other embodiments, the anti-reflective material is disposed on the top surface. In some embodiments, the anti-reflective material is selected from the group consisting of magnesium fluoride, $SiO_2$, $CeF_3$, $Al_2O_3$, $Y_2O_3$, $HfO_2$, $Sc_2O_3$, $Ta_2O_5$, and $Nb_2O_5$, $LaTiO_3$ and $TiO_2$.

According to another embodiment, a processing chamber is disclosed. The processing chamber comprises a heating element emitting light at one or more wavelengths absorbed by a workpiece; a workpiece support to hold the workpiece, the workpiece support comprising a top surface proximate the workpiece and a bottom surface; and an anti-reflective material disposed on at least a portion of the top surface or the bottom surface; wherein transmittance through the workpiece support is improved by at least 5% at the one or more wavelengths emitted by the heating element. In certain embodiments, the anti-reflective material is disposed on the top surface and the bottom surface. In certain embodiments, the top surface of the workpiece support does not contact an entirety of the workpiece. In certain embodiments, the heating element comprises a tungsten halogen bulb or an LED. In certain embodiments, transmittance through the workpiece support is improved by at least 10% at the one or more wavelengths emitted by the heating element. In certain embodiments, the workpiece support comprises an end effector.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
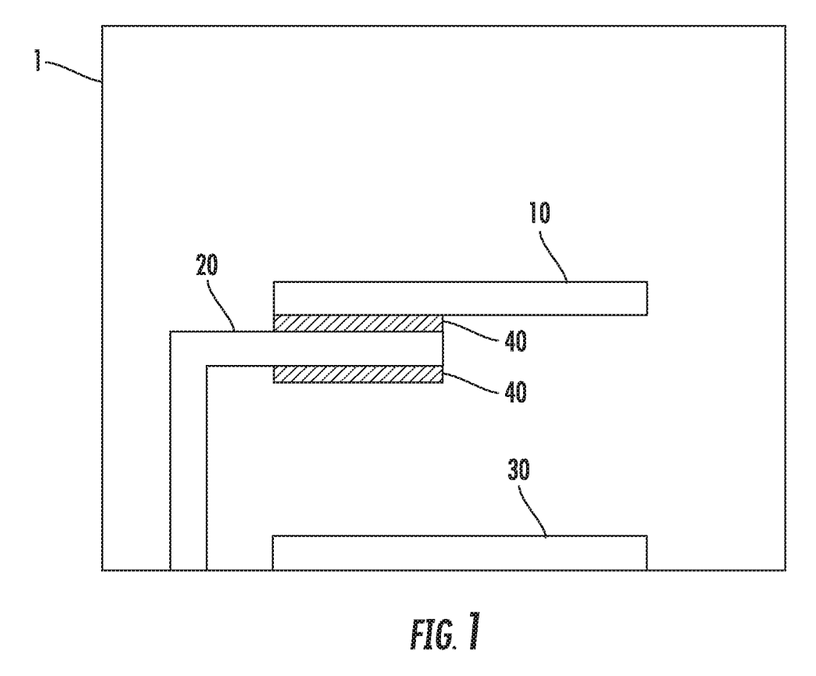
FIG. 1 is a representative side view of the workpiece support coated with an antireflective material disposed within a processing chamber according to one embodiment.

FIG. 1 shows a processing chamber 1 which may be used to process a workpiece 10. In certain embodiments, the processing chamber 1 is used exclusively to heat the workpiece 10. In other embodiments, another semiconductor process, such as implantation, may also be performed in the processing chamber.

Figure 2:
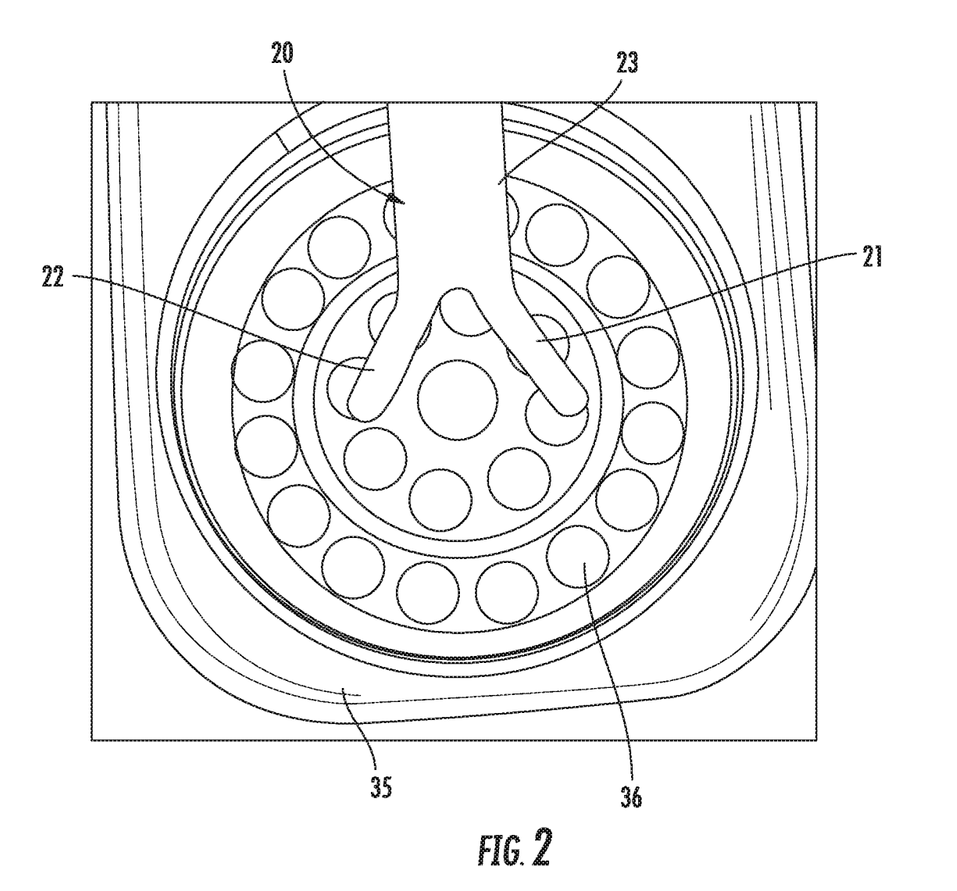
FIG. 2 is a representative top view of a workpiece support.

The workpiece 10 may be supported by a workpiece support 20. This workpiece support 20 may be movable. For example, the workpiece support 20 may be used to transport the workpiece 10 from a load lock or other port to its processing position. In other embodiments, the workpiece support 20 may be capable of vertical movement. In certain embodiments, the workpiece support 20 may be stationary. The workpiece support 20 is used to hold the workpiece 10. In some embodiments, the workpiece support 20 does not contact or support the entirety of the workpiece 10. For example, the workpiece support 20 may be a plurality of pedestals equally spaced along the circumference of the workpiece 10. In certain embodiments, the workpiece support 20 may be an end effector. The end effector may have two prongs 21, 22 and a handle 23, arranged in a Y-configuration, as shown in FIG. 2. The length and width of the handle 23 and two prongs 21,22 can vary, depending on the particular application. Thus, the workpiece support 20 may contact less than the entirety of the workpiece 10.

In the embodiment shown in FIG. 1, one or more heating elements 30 may be disposed on or near a bottom surface of the processing chamber 1. In some embodiments, the heating elements 30 are disposed in a heating module 35, as shown in FIG. 2. The heating module 35 may house a plurality of tungsten halogen light bulbs 36, arranged in one or more concentric circles.

In other embodiments, the heating elements 30 may be LEDs, such as an LED array, which emits light at a wavelength that is readily absorbed by the workpiece 10. Thus, the heating elements 30 may emit light at a wavelength or range of wavelengths, that are absorbed by the workpiece. The particular type and configuration of the heating elements 30 is not limited by this disclosure.

In certain embodiments, due to the configuration of the processing chamber 1, the workpiece support may be disposed between the heating elements 30 and the workpiece 10. Consequently, the portion of the workpiece 10 disposed directly above the workpiece support 20 may receive less light that other portions of the workpiece 10. Further, since the workpiece support 20 contacts less than the entirety of the workpiece 10, certain portions of the workpiece 10 are directly heated by the heating elements 30, while other portions of the workpiece 10 are heated by light that passes first through the workpiece support 20.

To compensate for this, the workpiece support 20 may be constructed of a nearly transparent material, such as clear quartz. In this disclosure, the term "nearly transparent" denotes the ability for the material to transmit at least 80% of the light in the frequency range emitted by the heating elements 30. For example, clear quartz may transmit about 88-90% of the light at the frequencies that are absorbed by the workpiece 10.

In other words, the portion of the workpiece 10 that is disposed directly above the workpiece support 20 may receive 10-12% less light than other portions of the workpiece 10. Consequently, this portion of the workpiece 10 may be at a lower temperature than the rest of the workpiece 10. In certain embodiments, this difference may be 50° C. or more.

Advantageously, the workpiece support 20 of the present disclosure is coated with an anti-reflective material 40. This anti-reflective material 40 may be magnesium fluoride, or another suitable material. Other suitable materials include, but are not limited to, $SiO_2$, $CeF_3$, $Al_2O_3$, $Y_2O_3$, $HfO_2$, $Sc_2O_3$, $Ta_2O_5$, $Nb_2O_5$, $LaTiO_3$ and $TiO_2$ and others. The anti-reflective material 40 may also be a multi-layer optical coating.

While FIG. 1 shows the anti-reflective material 40 disposed on the top surface and the bottom surface of the workpiece support 20, other embodiments are also possible. For example, as described below, the anti-reflective material 40 may only be disposed on the top surface of the workpiece support 20 or may only be disposed on the bottom surface of the workpiece support 20.

Figure 3:
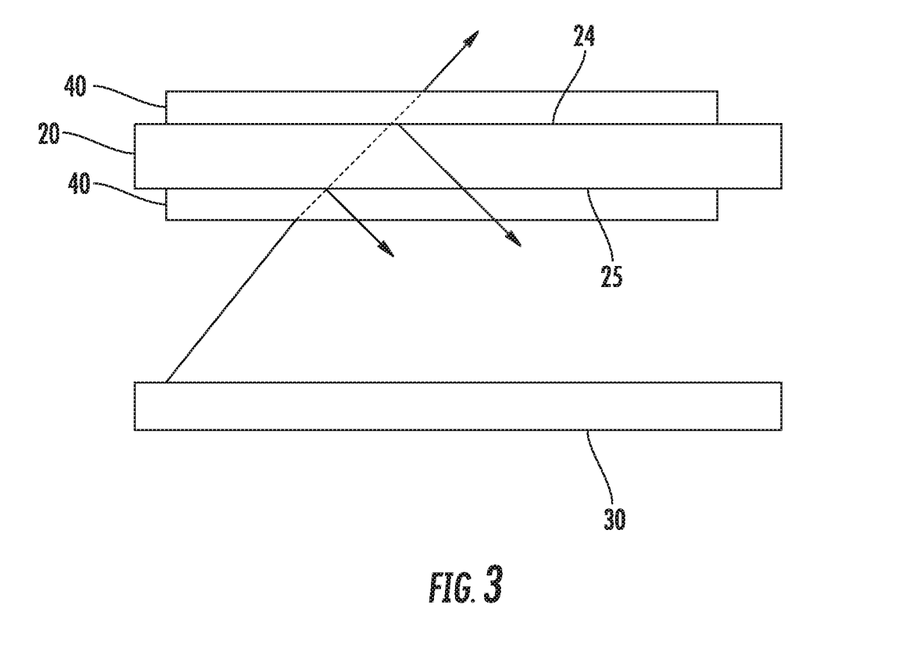
FIG. 3 shows the interaction between the heat elements and the workpiece support.

FIG. 3 shows the interaction between the heating elements 30 and the workpiece support 20. Light emitted from the heating elements 30 may be reflected at two interfaces. In this figure, the workpiece may be disposed on top of the top surface 24 of the workpiece support 20. First, some of the light from the heating elements 30 is reflected at the interface between the vacuum environment and the bottom surface 25 of the workpiece support 20. Second, some of the light is also reflected at the interface between the top surface 24 of the workpiece support 20 and the workpiece. The introduction of an anti-reflective material 40 on one or both of these surfaces will reduce the amount of reflection, increasing the amount of light that is transmitted to the workpiece 10. In certain embodiments, the anti-reflective material 40 is disposed only on the side of the workpiece support 20 that faces the heating elements 30. In other embodiments, the anti-reflective material 40 is disposed only on the side of the workpiece support 20 that faces away from the heating elements 30. In certain embodiments, the anti-reflective material 40 is disposed on both surfaces. In some embodiments, the anti-reflective material 40 is disposed on the entirety of these surfaces. In other embodiments, the anti-reflective material 40 is disposed on only a portion of these surfaces.

The anti-reflective material 40 is selected so as to withstand operating conditions within the processing chamber 1. These operating conditions may include temperatures in excess of 250° C. In some embodiments, these operating conditions may include temperatures in excess of 500° C. Additionally, the anti-reflective material 40 is selected so that it withstands the light flux emitted from the heating elements 30. The selections of the anti-reflective material 40 may also be a function of the wavelengths that are emitted by the heating elements 30.

By coating at least a portion of one surface of the workpiece support 20 with the anti-reflective material 40, the amount of light that reaches the portion of the workpiece directly above the workpiece support 20 is increased. For example, depending on the type of anti-reflective material and which surfaces are coated, the transmission of light through the workpiece support 20 may increase from 88-90% (uncoated) to over 98%.

Figure 5:
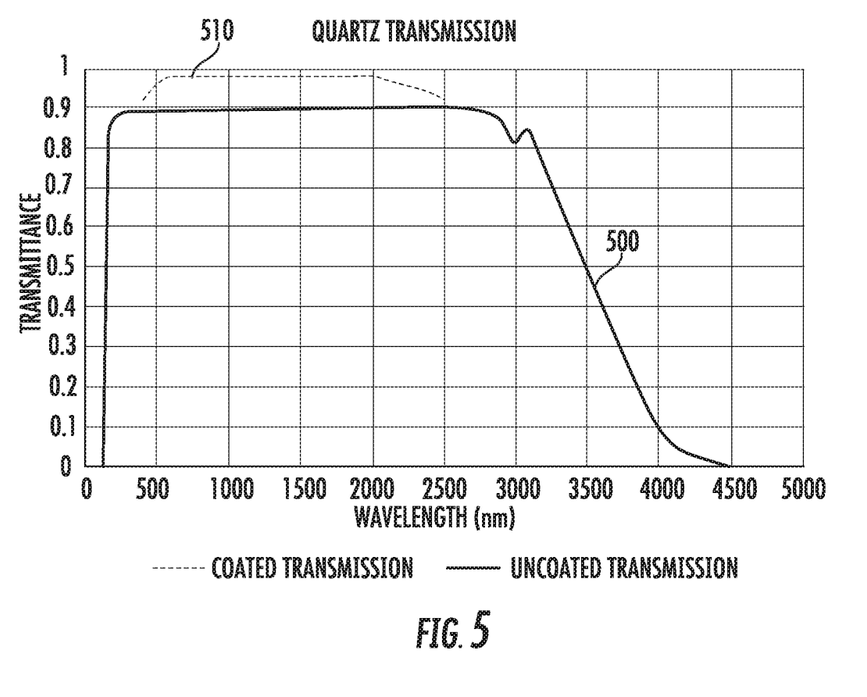
FIG. 5 is a graph illustrating the improvement in transmittance of a quartz workpiece support when using an anti-reflective coating.

FIG. 5 shows the effects of coating the workpiece support 20 with an anti-reflective material 40. The vertical axis represents transmittance, as a fraction. The horizontal axis represents wavelength in nanometers. Line 500 shows the transmittance as a function of wavelength for a workpiece support 20 that is not coated. Line 510 shows the transmittance as a function of wavelength for a workpiece support 20 coated with an anti-reflective material 40. Line 510 extends only to 2500 nanometers, since most heating elements 30 emit light at wavelengths shorter than 2500 nm. As can be seen, the increase in transmittance in the range from 400 nm to 2500 nm is obvious and is about 10% throughout this range. Thus, in certain embodiments, the application of the anti-reflective material 40 increases the transmittance of the workpiece support 20 by at least 5% at the wavelengths emitted from the heating element 30. In certain embodiments, the application of the anti-reflective material 40 increases the transmittance of the workpiece support 20 by at least 10% at the wavelengths emitted from the heating element 30. This improves the temperature uniformity of the workpiece 10 during the heating process.

The application of an anti-reflective material 40 to the workpiece support 20 may have other benefits as well. It has been found that the temperature of the workpiece support 20 increases as a result of extended exposure to the heating elements 30. By applying an anti-reflective material 40 to the workpiece support 20, the absorption of heat by the workpiece support 20 may be reduced, lowering its temperature. Thus, over time, the temperature of the workpiece support 20 coated with an anti-reflective material 40 may be lower than a workpiece support 20 without the anti-reflective material 40.

Figure 4:
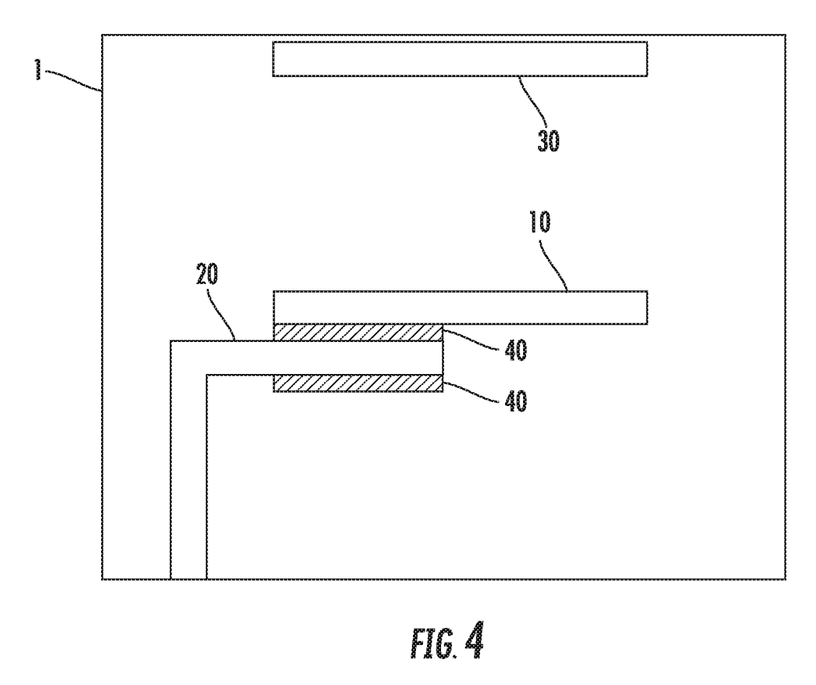
FIG. 4 is a representative side view of the workpiece support within a processing chamber according to a second embodiment.

In another embodiment, shown in FIG. 4, the heating elements 30 may be disposed above the workpiece 10. In this embodiment, the workpiece support 20 does not block any light from reaching the workpiece 10. However, the workpiece support 20 may affect the temperature of the workpiece 10 in two ways. First, as stated above, without the anti-reflective material 40, the workpiece support 20 reflects some of the light back toward the heating elements 30. In this case, that reflected light passes again through the workpiece 10, locally heating the portion of the workpiece 10 directly above the workpiece support 20. Second, as described above, the workpiece support 20 may absorb some of the heat, making it hotter than the workpiece 10. The application of anti-reflective material 40 may reduce this effect as well.

As described above, the anti-reflective material 40 may be disposed on the top surface of the workpiece support 20 that faces the heating elements 30. In certain embodiments, the anti-reflective material 40 may also be disposed on the bottom surface of the workpiece support 20 that faces away from the heating elements 30. Further, in certain embodiments, the anti-reflective material 40 may only be disposed on the bottom surface of the workpiece support 20 that faces away from the heating elements 30. As described above, the anti-reflective material 40 may be disposed on an entirety of the surface or only a portion of the surface of the workpiece support 20.

In summary, the present system has many advantages. First, in reference to the embodiment shown in FIG. 1, the application of anti-reflective material to at least a portion of one or both surfaces of the workpiece support 20 increases the transmission of light though the workpiece support 20. This reduces the disparity in temperature between the portion of the workpiece disposed directly above the workpiece support 20 and the other portions of the workpiece 10. Thus, the temperature uniformity of the workpiece 10 is improved by the application of the anti-reflective material 40 to the workpiece support 20. Second, the present system can be retrofit to existing process chambers. It may be possible to apply the coating of anti-reflective material to existing workpiece supports 20 to achieve the benefits described herein. Third, the application of the anti-reflective material 40 may reduce the amount of light absorbed by the workpiece support 20. This may reduce the temperature of the workpiece support 20 after prolonged exposure to the heating elements 30.

For the embodiment shown in FIG. 4, the anti-reflective material 40 serves to reduce the reflection of light back through the portion of the workpiece 10 disposed directly above the workpiece support 20. This may improve temperature uniformity of the workpiece. Additionally, as stated above, it may be possible to apply the coating of anti-reflective material to existing workpiece supports 20 to achieve the benefits described herein. Finally, as described above, the application of the anti-reflective material 40 may reduce the amount of light absorbed by the workpiece support 20.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A processing chamber, comprising:
   a workpiece support to hold a workpiece, the workpiece support comprising:
      a top surface proximate the workpiece and a bottom surface; and
      an anti-reflective material disposed on at least a portion of the top surface or the bottom surface; and
   a heating element emitting light at one or more wavelengths absorbed by a workpiece, wherein the workpiece support is disposed between the heating element and the workpiece, such that certain portions of the workpiece are directly heated by light from the heating element and other portions of the workpiece are heated by light from the heating element that first passes through the workpiece support.

2. The processing chamber of claim 1, wherein the top surface of the workpiece support does not contact an entirety of the workpiece.

3. The processing chamber of claim 1, wherein the workpiece support is nearly transparent at wavelengths emitted by the heating element.

4. The processing chamber of claim 3, wherein the workpiece support comprises clear quartz.

5. The processing chamber of claim 1, wherein the heating element comprises a tungsten halogen bulb or an LED.

6. The processing chamber of claim 1, wherein the anti-reflective material is disposed on the top surface and the bottom surface.

7. The processing chamber of claim 1, wherein the anti-reflective material is disposed on the bottom surface.

8. The processing chamber of claim 1, wherein the anti-reflective material is selected from the group consisting of magnesium fluoride, $SiO_2$, $CeF_3$, $Al_2O_3$, $Y_2O_3$, $HfO_2$, $Sc_2O_3$, $Ta_2O_5$, and $Nb_2O_5$, $LaTiO_3$ and $TiO_2$.

9. A processing chamber, comprising:
a workpiece support to hold a workpiece, the workpiece support comprising:
a top surface proximate the workpiece and a bottom surface; and
an anti-reflective material disposed on at least a portion of the top surface or the bottom surface; and
a heating element emitting light at one or more wavelengths absorbed by a workpiece, wherein the workpiece is disposed between the heating element and the workpiece support, such that the workpiece is only heated by light from the heating element and an entirety of the workpiece is directly heated by light from the heating element.

10. The processing chamber of claim 9, wherein the top surface of the workpiece support does not contact an entirety of the workpiece.

11. The processing chamber of claim 9, wherein the heating element comprises a tungsten halogen bulb or an LED.

12. The processing chamber of claim 9, wherein the anti-reflective material is disposed on the top surface and the bottom surface.

13. The processing chamber of claim 9, wherein the anti-reflective material is disposed on the top surface.

14. The processing chamber of claim 9, wherein the anti-reflective material is selected from the group consisting of magnesium fluoride $SiO_2$, $CeF_3$, $Al_2O_3$, $Y_2O_3$, $HfO_2$, $Sc_2O_3$, $Ta_2O_5$, $Nb_2O_5$, $LaTiO_3$ and $TiO_2$.

15. A processing chamber, comprising:
a heating element emitting light at one or more wavelengths absorbed by a workpiece;
a workpiece support to hold the workpiece, the workpiece support comprising a top surface proximate the workpiece and a bottom surface, and wherein the workpiece support comprises an end effector comprising two prongs and a handle arranged in a Y-configuration; and
an anti-reflective material disposed on at least a portion of the top surface or the bottom surface; wherein transmittance of light from the heating elements through the workpiece support is improved by at least 5% at the one or more wavelengths emitted by the heating element as compared to a workpiece support on which the antireflective material is not disposed.

16. The processing chamber of claim 15, wherein the anti-reflective material is disposed on the top surface and the bottom surface.

17. The processing chamber of claim 15, wherein the top surface of the workpiece support does not contact an entirety of the workpiece.

18. The processing chamber of claim 15, wherein the heating element comprises a tungsten halogen bulb or an LED.

19. The processing chamber of claim 15, wherein transmittance of light from the heating elements through the workpiece support is improved by at least 10% at the one or more wavelengths emitted by the heating element as compared to a workpiece support on which the antireflective material is not disposed.

* * * * *